(12) United States Patent
Yuan

(10) Patent No.: US 11,152,588 B2
(45) Date of Patent: Oct. 19, 2021

(54) OLED LIGHT EMITTING DEVICE AND OLED DISPLAY DEVICE HAVING A SMOOTHING LAYER

(71) Applicant: WUHAN CHINA STAR OPTOELECTRONICS SEMICONDUCTOR DISPLAY TECHNOLOGY CO., LTD., Hubei (CN)

(72) Inventor: Tao Yuan, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 500 days.

(21) Appl. No.: 16/092,320

(22) PCT Filed: Aug. 30, 2018

(86) PCT No.: PCT/CN2018/103131
§ 371 (c)(1),
(2) Date: Oct. 9, 2018

(87) PCT Pub. No.: WO2019/227732
PCT Pub. Date: Dec. 5, 2019

(65) Prior Publication Data
US 2021/0184158 A1    Jun. 17, 2021

(30) Foreign Application Priority Data
May 31, 2018  (CN) .......................... 201810550489.8

(51) Int. Cl.
*H01L 51/00* (2006.01)
*H01L 51/50* (2006.01)
(Continued)

(52) U.S. Cl.
CPC .... *H01L 51/5234* (2013.01); *G02F 1/133305* (2013.01); *H01L 27/3244* (2013.01);
(Continued)

(58) Field of Classification Search
CPC ............. H01L 51/5234; H01L 51/0097; H01L 51/5253; H01L 51/5092; H01L 51/5088;
(Continued)

(56) References Cited

U.S. PATENT DOCUMENTS 9,299,956 B2 * 3/2016 Savas ................ H01L 31/02167
9,755,005 B2 * 9/2017 Nakamura ............ H01L 27/322
(Continued)

FOREIGN PATENT DOCUMENTS

| CN | 1713787 A | 12/2005 |
|---|---|---|
| CN | 105325056 B | 9/2017 |
| TW | 201818785 A | 5/2018 |

*Primary Examiner* — Ida M Soward

(57) ABSTRACT

An OLED light emitting device includes a substrate, a thin film transistor, an anode, an organic light emitting layer, a cathode, and a smoothing layer. The smoothing layer is disposed between the organic light emitting layer and the cathode. This improves transmittance of the cathode, and further improves light-emitting performance of the OLEO light emitting device.

14 Claims, 1 Drawing Sheet

(51) Int. Cl.
*H01L 51/52* (2006.01)
*H01L 33/44* (2010.01)
*G02F 1/133* (2006.01)
*H01L 27/32* (2006.01)
*G02F 1/1333* (2006.01)

(52) U.S. Cl.
CPC .......... *H01L 33/44* (2013.01); *H01L 51/0097* (2013.01); *H01L 51/5056* (2013.01); *H01L 51/5072* (2013.01); *H01L 51/5088* (2013.01); *H01L 51/5092* (2013.01); *H01L 51/5253* (2013.01); *H01L 2251/301* (2013.01); *H01L 2251/5338* (2013.01); *H01L 2251/558* (2013.01)

(58) Field of Classification Search
CPC ............. H01L 51/5056; H01L 51/5072; H01L 2251/5338; H01L 2251/301; H01L 2251/558; H01L 33/44; G02F 1/133305
See application file for complete search history.

(56) References Cited

U.S. PATENT DOCUMENTS

| | | | |
|---|---|---|---|
| 2005/0287392 | A1 | 12/2005 | Toyoda |
| 2007/0167023 | A1* | 7/2007 | Yamazaki ......... H01L 21/76802 438/717 |
| 2009/0218943 | A1* | 9/2009 | Nishimura .......... H01L 51/5275 313/512 |
| 2012/0091436 | A1* | 4/2012 | Forrest ................ H01L 51/5004 257/40 |
| 2016/0155988 | A1 | 6/2016 | Kuroki |
| 2017/0031205 | A1* | 2/2017 | Lee ................... G02F 1/133555 |
| 2019/0189932 | A1 | 6/2019 | Sekine et al. |

* cited by examiner

OLED LIGHT EMITTING DEVICE AND OLED DISPLAY DEVICE HAVING A SMOOTHING LAYER

FIELD OF INVENTION

The present disclosure relates to the field of display technologies, and more particularly to an OLED light emitting device and an OLED display device.

BACKGROUND OF INVENTION

Compared with conventional thin film transistor liquid crystal display (TFT LCD) technologies, organic light emitting diodes (OLEDs) have advantages of being flexible devices and have wide applications. OLEDs can be divided into passive OLEDs and active OLEDs according to driving methods. Passive OLEDs require higher current and voltage when displaying, thus resulting in increased power consumption, a drastic reduction in display performance, and large-area display limitations. Active OLEDs are driven by thin film transistors and individually emit light for each pixel. The active OLEDs have advantages of high brightness, high resolution, low power consumption, easy colorization, and large-area display. The active OLEDs are commonly used.

Commonly used active OLED light emitting device includes a substrate, an indium tin oxides (ITO) anode, a hole injection layer, a hole transport layer, a light emitting layer, an electron injection layer, an electron transport layer, and a cathode. The OLED light emitting device adopts top emission and needs a cathode to have good transmittance. In order to increase transmittance of the cathode, a thickness of the cathode needs to be reduced. However, a reduced thickness of the cathode leads to an increase resistance of the cathode.

In summary, a new OLED light emitting device is needed to solve the problem of a reduced thickness of the cathode and an increase resistance of the cathode existing in the existing OLED light emitting device.

SUMMARY OF INVENTION

An object of the present disclosure is to provide an OLED light emitting device and an OLED display device, to solve the problem that the conventional OLED light emitting device improves transmittance of the cathode by reducing thickness of the cathode, thereby leading to increased resistance of the cathode.

To achieve the above object, an embodiment of the present disclosure provides an OLED light emitting device. The OLED light emitting device includes a substrate, a thin film transistor, an anode, an organic light emitting layer, a cathode, an anti-reflective layer, and a smoothing layer. The thin film transistor is disposed on the substrate. The anode is disposed on the thin film transistor. The anode is connected to the thin film transistor. The organic light emitting layer is disposed on the anode. The cathode is disposed on the organic light emitting layer. The anti-reflective layer is disposed on the cathode. The smoothing layer is disposed between the organic light emitting layer and the cathode. The smoothing layer is configured to form a flat surface on the cathode.

In an embodiment of the present disclosure, the smoothing layer is made of Cu.

In an embodiment of the present disclosure, the smoothing layer has a thickness ranging from 0.8 nm to 1.2 nm.

In an embodiment of the present disclosure, the anti-reflective layer is made of ZnO or TiO2.

In an embodiment of the present disclosure, the substrate is a flexible substrate, and the flexible substrate is made of a polyimide material.

In an embodiment of the present disclosure, the organic light emitting layer includes a hole injection layer, a hole transport layer, a light emitting layer, an electron transport layer, and an electron injection layer disposed in order.

An embodiment of the present disclosure further provides an OLED display device. The OLED display device includes an OLED light emitting device and an encapsulating layer covering the OLED light emitting device. The OLED light emitting device includes a substrate, a thin film transistor, an anode, an organic light emitting layer, a cathode, and a smoothing layer. The thin film transistor is disposed on the substrate. The anode is disposed on the thin film transistor. The anode is connected to the thin film transistor. The organic light emitting layer is disposed on the anode. The cathode is disposed on the organic light emitting layer. The smoothing layer is disposed between the organic light emitting layer and the cathode.

In an embodiment of the present disclosure, the smoothing layer is made of Cu, and the smoothing layer has a thickness ranging from 0.8 nm to 1.2 nm.

In an embodiment of the present disclosure, the OLED light emitting device further includes an anti-reflective layer disposed on the cathode.

An embodiment of the present disclosure further provides an OLED light emitting device. The OLED light emitting device includes a substrate, a thin film transistor, an anode, an organic light emitting layer, a cathode, and a smoothing layer. The thin film transistor is disposed on the substrate. The anode is disposed on the thin film transistor. The anode is connected to the thin film transistor. The organic light emitting layer is disposed on the anode. The cathode is disposed on the organic light emitting layer. The smoothing layer is disposed between the organic light emitting layer and the cathode. The smoothing layer is configured to form a flat surface on the cathode.

In an embodiment of the present disclosure, the smoothing layer is made of Cu.

In an embodiment of the present disclosure, the smoothing layer has a thickness ranging from 0.8 nm to 1.2 nm.

In an embodiment of the present disclosure, the substrate is a flexible substrate, and the flexible substrate is made of a polyimide material.

In an embodiment of the present disclosure, the organic light emitting layer includes a hole injection layer, a hole transport layer, a light emitting layer, an electron transport layer, and an electron injection layer disposed in order.

The beneficial effects of the embodiment of the present disclosure are as follows. The OLED light emitting device and the OLED display device of the embodiment improve smooth flatness of the cathode by providing a smoothing layer between the organic light emitting layer and the cathode, so as to reduce resistance of the cathode and dark current of the OLED lighting device. In addition, the reduced thickness of the cathode can increase transmittance of the cathode and also reduce manufacturing cost of the OLED lighting device.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
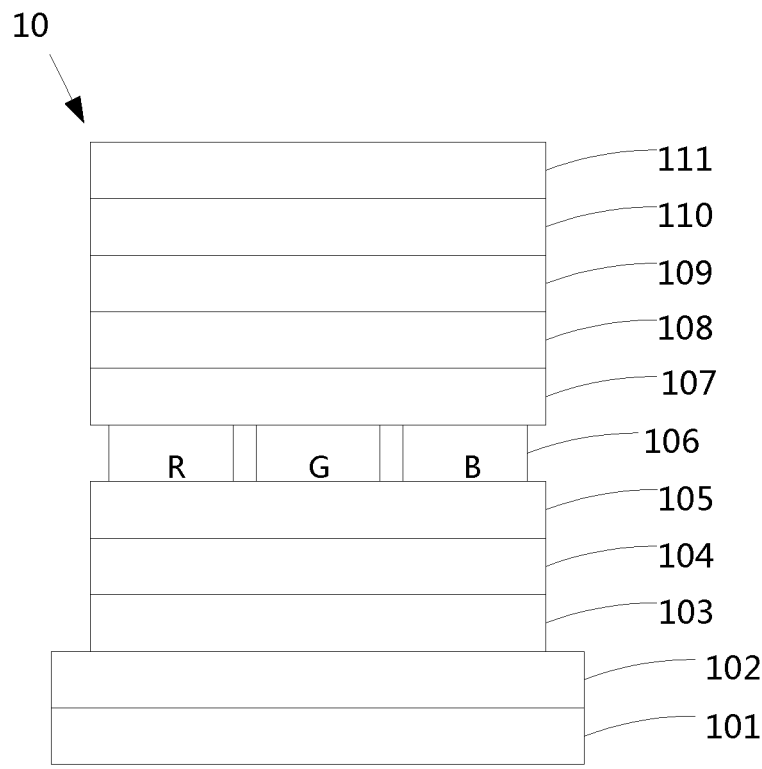
FIG. 1 is a schematic structural diagram of an OLED light emitting device according to an embodiment of the present disclosure.

The specific embodiments described with reference to the attached drawings are all exemplary and are intended to illustrate and interpret the present disclosure. In the description of the present disclosure, it should be understood that terms such as "upper," "lower," "front," "rear," "left," "right," "inside," "outside," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, similar structural units are denoted by same reference numerals.

In existing OLED light emitting devices, increasing transmittance of the cathode requires reducing thickness of the cathode. If the thickness of the cathode is reduced, a surface of the cathode is uneven and unsmooth, and resistance of the cathode is also increased, thereby affecting display performance. The embodiment of the present disclosure can solve the drawback.

Figure 2:
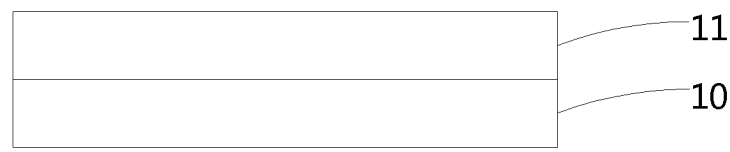
FIG. 2 is another schematic structural diagram of an OLED light emitting device according to an embodiment of the present disclosure.
Figure 3:
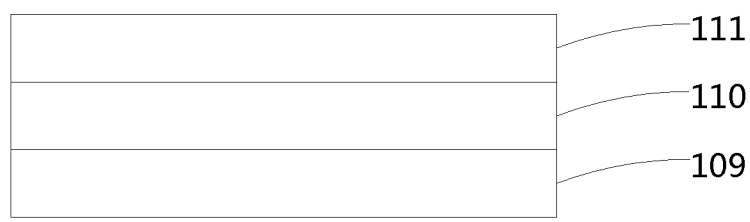
FIG. 3 is still another schematic structural diagram of an OLED light emitting device according to an embodiment of the present disclosure.

Refer to FIG. 1 to FIG. 3, an OLED light emitting device 10 of the embodiment includes a substrate 101, a thin film transistor 102, an anode 103, an organic light emitting layer, a cathode 110, a smoothing layer 109, and an anti-reflective layer 111. Referring to FIG. 2, an OLED display device includes an OLED light emitting device 10 and an encapsulating layer 11 covering the OLED light emitting device 10.

The substrate 101 is a flexible substrate, and the flexible substrate is made of polyimide (PI) material to form a transparent substrate First, the thin film transistor 102 is formed on a surface of the flexible substrate 101 by a yellow light process, and the thin film transistor 102 is a low temperature poly-silicon thin film transistor (LTPS-TFT).

The anode 103 is formed on the thin film transistor 102 by magnetron sputtering, and the anode 103 is connected to the thin film transistor 102. In order to increase hole injection performance, work function of the anode 103 is required to be as high as possible, and the anode 103 also needs to have good conductivity and good chemical and morphological stability. In the embodiment, material of the anode 103 is indium tin oxides (ITO), and ITO has good conductivity and transmittance.

The organic light-emitting layer includes a hole injection layer 104, a hole transport layer 105, a light emitting layer 106, an electron transport layer 107, and an electron injection layer 108 disposed in order. The light emitting layer 106 is disposed between the hole transport layer 105 and the electron transport layer 107, the hole injection layer 104 is disposed on the anode 103, and the organic light emitting layer is formed by vacuum thermal evaporation. In the embodiment, the light emitting layer 106 adopts a host-guest doping structure and a doping guest is a phosphorescent material.

The cathode 110 uses a material with a work function that is as small as possible in order to increase electron injection performance. The smaller the work function, the higher light emission brightness and the longer life. In the embodiment, material of the cathode 110 is an alloy material of Mg and Ag, thickness ratio of Mg and Ag is 1:10, and Mg:Ag cathode is formed by vacuum thermal co-evaporation.

Due to migration of silver atoms during thermal evaporation deposition of Ag, silver islands are formed, a surface of a silver film is discontinuous, thereby increasing absorption of the silver film, reducing the transmittance of the silver film, and increasing resistance of the silver film. In the embodiment, before evaporation of the cathode 110, a thin layer of copper is deposited on the organic light emitting layer as a smoothing layer 109. Since a surface energy of copper is greater than a surface energy of silver, migration of the silver atoms can be suppressed, so as to achieve a continuous smooth silver film with a thinner thickness.

The smoothing layer 109 has a thickness ranging from 0.8 nm to 1.2 nm. In the embodiment, the smoothing layer 109 has a thickness of 1 nm.

By vapor-depositing a layer of copper on the organic light emitting layer, wettability of the cathode 110 on the organic light emitting layer is improved, so that a smooth and flat cathode film can be obtained at a relatively thin thickness. A smooth and flat surface of the cathode 110 helps reduce resistance of the cathode 110 and dark current of the OLED light emitting device. A thickness of the cathode 110 can be reduced to 4-10 nm, and reduction of the thickness of the cathode 110 can increase transmittance of the cathode 110 and reduce manufacturing cost of the OLED light emitting device. In the embodiment, the cathode 110 has a thickness of 7 nm.

The anti-reflective layer 111 is formed on the cathode 110 by magnetron sputtering. The anti-reflective layer 111 further improves the transmittance of the cathode 110. The anti-reflective layer 111 is ZnO or $TiO_2$. In the embodiment, a material of the anti-reflective layer 111 is ZnO.

An embodiment of the present disclosure further provides an OLED display device. The OLED display device includes an arrayed OLED light emitting device and an encapsulating layer covering the OLED light emitting device. The OLED light emitting device includes a substrate, a thin film transistor, an anode, an organic light emitting layer, a cathode, and a smoothing layer. The thin film transistor is disposed on the substrate. The anode is disposed on the thin film transistor. The anode is connected to the thin film transistor. The organic light emitting layer is disposed on the anode. The cathode is disposed on the organic light emitting layer. The smoothing layer is disposed between the organic light emitting layer and the cathode. The smoothing layer is configured to form a flat surface on the cathode.

The substrate is a flexible substrate, and the flexible substrate is made of polyimide (PI) material to form a transparent substrate The thin film transistor is formed on a surface of the flexible substrate by a yellow light process, and the thin film transistor is a low temperature poly-silicon thin film transistor (LTPS-TFT).

The anode is formed on the thin film transistor by magnetron sputtering, and the anode is connected to the thin film transistor. Material of the anode is indium tin oxides (ITO).

The organic light-emitting layer includes a hole injection layer, a hole transport layer, a light emitting layer, an electron transport layer, and an electron injection layer disposed in order. The light emitting layer is disposed between the hole transport layer and the electron transport layer, the hole injection layer is disposed on the anode, and the organic light emitting layer is formed by vacuum thermal evaporation. In the embodiment, the light emitting layer adopts a host-guest doping structure and a doping guest is a phosphorescent material.

Material of the cathode is an alloy material of Mg and Ag, thickness ratio of Mg and Ag is 1:10, and Mg:Ag cathode is formed by vacuum thermal co-evaporation.

Before evaporation of the cathode, the smoothing layer is deposited on the organic light emitting layer. Due to migration of silver atoms during thermal evaporation deposition of Ag, silver islands are formed, a surface of a silver film is discontinuous, thereby increasing absorption of the silver film, reducing transmittance of the silver film, and increasing resistance of the silver film. Since a surface energy of copper is greater than a surface energy of silver, migration of the silver atoms can be suppressed, so as to achieve a continuous smooth silver film with a thinner thickness. The smoothing layer has a thickness of 1 nm.

By vapor-depositing a layer of copper on the organic light emitting layer, wettability of Mg:Ag cathode on the organic light emitting layer is improved, so that a smooth and flat cathode film can be obtained at a relatively thin thickness. A smooth and flat surface of the cathode 110 helps reduce resistance of the cathode 110 and dark current of the OLED light emitting device. A thickness of the cathode 110 can be reduced to 4-10 nm. In the embodiment, the cathode 110 has a thickness of 7 nm.

The anti-reflective layer 111 is formed on the cathode 110 by magnetron sputtering. The anti-reflective layer 111 further improves the transmittance of Mg:Ag cathode. The anti-reflective layer 111 is ZnO or TiO2. In the embodiment, a material of the anti-reflective layer 111 is ZnO.

A thin film encapsulation layer is formed on the anti-reflective layer for protection. In detail, a first inorganic encapsulation layer is formed on the anti-reflective layer, an organic encapsulation layer is formed on the first inorganic encapsulation layer, and a second inorganic encapsulation layer is formed on the organic encapsulation layer. A material of the first inorganic encapsulation layer and a material of the second inorganic encapsulation layer each is $SiO_2$, and a chemical formula of the organic encapsulation layer is $SiO_xC_yH_z$.

The specific working principle of an OLED display device provided by the present disclosure is the same as or similar to that of the embodiment of the OLED light emitting device described above. Refer to the related description of the embodiment of the OLED light emitting device above for details.

The beneficial effects of the embodiment of the present disclosure are as follows. The OLED light emitting device and the OLED display device of the embodiment improve smooth flatness of the cathode by providing a smoothing layer between the organic light emitting layer and the cathode, so as to reduce resistance of the cathode and dark current of the OLED lighting device. In addition, the reduced thickness of the cathode can increase transmittance of the cathode and also reduce manufacturing cost of the OLED lighting device.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. An organic light emitting diode (OLED) light emitting device, comprising:
   a substrate;
   a thin film transistor disposed on the substrate;
   an anode disposed on the thin film transistor, wherein the anode is connected to the thin film transistor;
   an organic light emitting layer disposed on the anode;
   a cathode disposed on the organic light emitting layer;
   an anti-reflective layer disposed on the cathode; and
   a smoothing layer disposed between the organic light emitting layer and the cathode.

2. The OLED light emitting device according to claim 1, wherein the smoothing layer is made of Cu.

3. The OLED light emitting device according to claim 2, wherein the smoothing layer has a thickness ranging from 0.8 nm to 1.2 nm.

4. The OLED light emitting device according to claim 2, wherein the smoothing layer has a thickness ranging from 0.8 nm to 1.2 nm.

5. The OLED light emitting device according to claim 1, wherein the substrate is a flexible substrate, and the flexible substrate is made of a polyimide material.

6. The OLED light emitting device according to claim 1, wherein the organic light emitting layer comprises a hole injection layer, a hole transport layer, a light emitting layer, an electron transport layer, and an electron injection layer disposed in order.

7. An organic light emitting diode (OLED) display device, comprising an OLED light emitting device and an encapsulating layer covering the OLED light emitting device, the OLED light emitting device, comprising:
   a substrate;
   a thin film transistor disposed on the substrate;
   an anode disposed on the thin film transistor, wherein the anode is connected to the thin film transistor;
   an organic light emitting layer disposed on the anode;
   a cathode disposed on the organic light emitting layer; and
   a smoothing layer disposed between the organic light emitting layer and the cathode.

8. The OLED display device according to claim 7, wherein the smoothing layer is made of Cu, and the smoothing layer has a thickness ranging from 0.8 nm to 1.2 nm.

9. The OLED display device according to claim 7, wherein the OLED light emitting device further comprises an anti-reflective layer disposed on the cathode.

10. An organic light emitting diode (OLED) light emitting device, comprising:
    a substrate;
    a thin film transistor disposed on the substrate;
    an anode disposed on the thin film transistor, wherein the anode is connected to the thin film transistor;
    an organic light emitting layer disposed on the anode;
    a cathode disposed on the organic light emitting layer; and
    a smoothing layer disposed between the organic light emitting layer and the cathode.

11. The OLED light emitting device according to claim 10, wherein the smoothing layer is made of Cu.

12. The OLED light emitting device according to claim 11, wherein the smoothing layer has a thickness ranging from 0.8 nm to 1.2 nm.

13. The OLED light emitting device according to claim 10, wherein the substrate is a flexible substrate, and the flexible substrate is made of a polyimide material.

14. The OLED light emitting device according to claim 10, wherein the organic light emitting layer comprises a hole injection layer, a hole transport layer, a light emitting layer, an electron transport layer, and an electron injection layer disposed in order.

* * * * *